United States Patent [19]

Benveniste

[11] Patent Number: 5,373,164
[45] Date of Patent: Dec. 13, 1994

[54] ION BEAM CONICAL SCANNING SYSTEM

[75] Inventor: Victor M. Benveniste, Gloucester, Mass.

[73] Assignee: Eaton Corporation, Cleveland, Ohio

[21] Appl. No.: 198,548

[22] Filed: Feb. 18, 1994

Related U.S. Application Data

[63] Continuation of Ser. No. 914,875, Jan. 29, 1992.

[51] Int. Cl.$^5$ ............................................. H01J 37/317
[52] U.S. Cl. ................................. 250/492.21; 250/398
[58] Field of Search ............................. 250/492.21, 398

[56] References Cited

U.S. PATENT DOCUMENTS

| | | | |
|---|---|---|---|
| 4,276,477 | 6/1981 | Enge | 250/398 |
| 4,661,712 | 4/1987 | Mobley | 250/492.2 |
| 4,687,936 | 8/1987 | McIntyre et al. | 250/397 |
| 4,794,305 | 12/1988 | Matsukawa | 315/111.81 |
| 4,922,106 | 5/1990 | Berrian et al. | 250/492.2 |
| 4,942,342 | 7/1990 | Tsukakoshi | 315/410 |
| 5,091,655 | 2/1992 | Dykstra et al. | 250/492.2 |
| 5,099,130 | 3/1992 | Aitken | 250/492.21 |

FOREIGN PATENT DOCUMENTS 8801035 11/1989 Netherlands.

OTHER PUBLICATIONS

New Generation Ion Implanter for Sub-Micron Era, Ulvac Corporation.
European Search Report dated Nov. 3, 1993 for the European Counterpart (Appln No. 93304975.1).

*Primary Examiner*—Jack I. Berman
*Attorney, Agent, or Firm*—Watts, Hoffmann, Fisher & Heinke Co.

[57] ABSTRACT

An ion implantation system including structure to create a dipole field through which the beam passes. The strength and direction of the dipole field is controlled to adjust an angle of impact between the workpiece, typically a semi-conductor wafer and the ion beam. A side-to-side scanning motion is used to provide controlled doping of an entire semiconductor wafer.

8 Claims, 2 Drawing Sheets

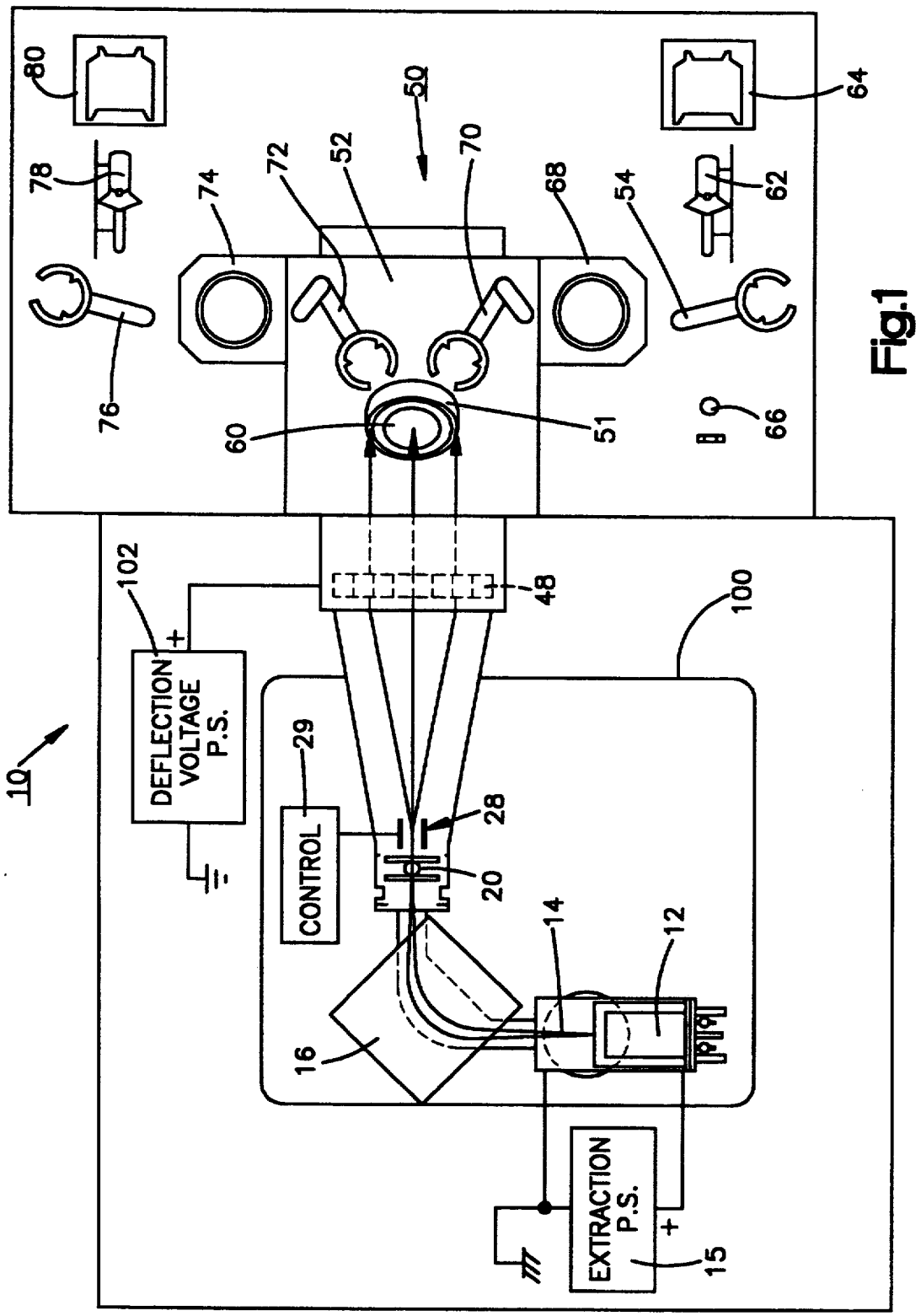

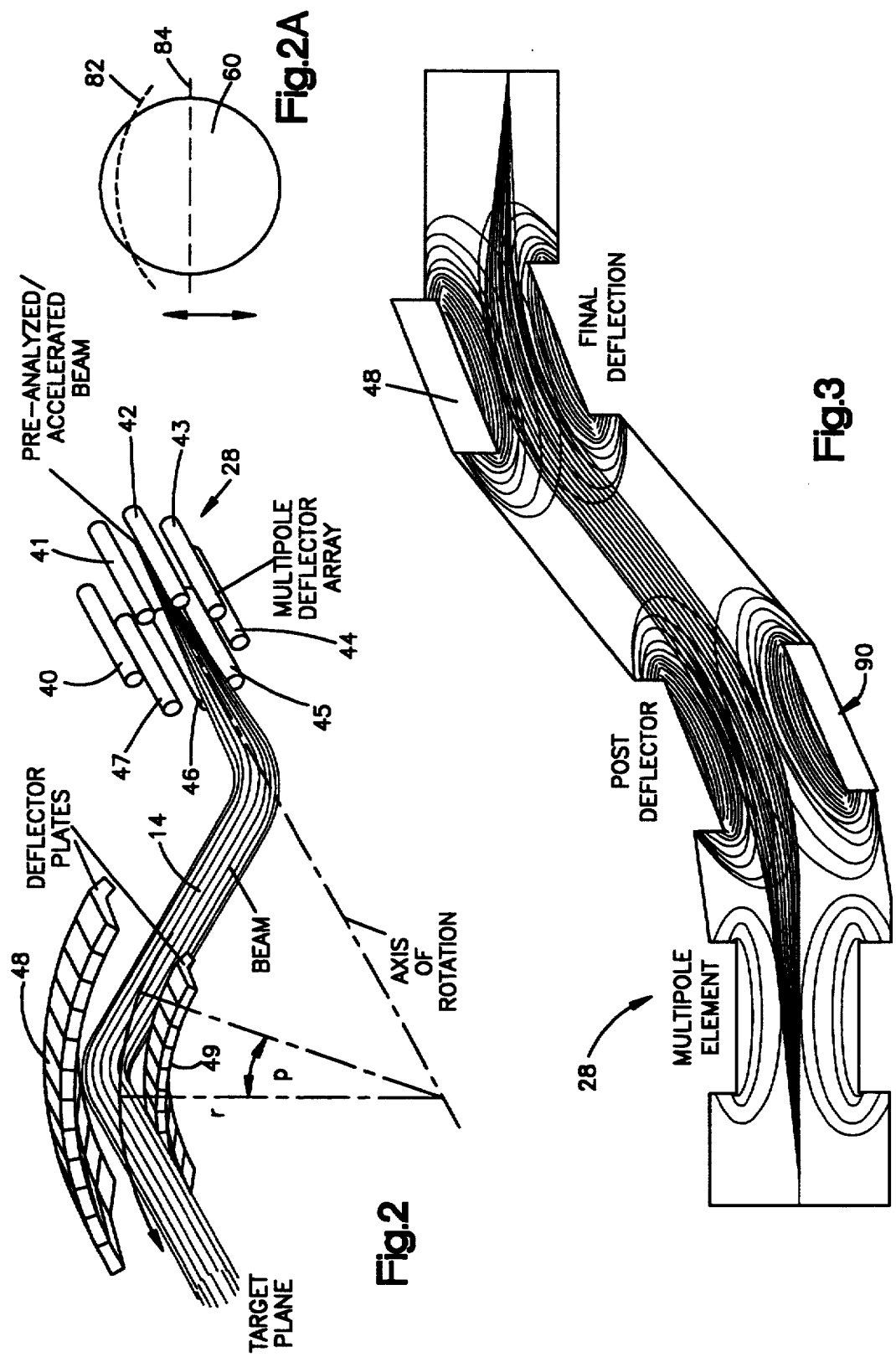

ION BEAM CONICAL SCANNING SYSTEM

This is a continuation of copending application(s) Ser. No. 07/914,875 filed on Jan. 29, 1992.

FIELD OF THE INVENTION

The present invention concerns an ion beam implant system that includes structure for deflecting ions to a surface of a silicon wafer so that the ions impact the silicon wafer at controlled impact angles as they scan across the wafer surface.

BACKGROUND ART

To enhance the yield in fabricating integrated circuits from semi-conductor wafers by ion beam doping, it is important to achieve doping uniformity across the wafer surface. One factor that affects doping uniformity is the uniformity of impact angle between the ion beam and the silicon wafer during ion implantation. In prior art medium current implanters, an ion beam is electrostatically deflected from an original trajectory by several degrees to sweep across the silicon wafer and dope the silicon wafer in a controlled, uniform manner. When the diameter of the silicon wafer is on the order of 10 centimeters, such deflection produces small angular deviations of impact angle. As the size of the silicon wafer increases, however, the deviation in impact angle from the center to the outer edge of the wafer also increases.

To sweep across larger diameter wafers, the medium current ion beam trajectory has increased, causing problems in beam transmission. Increasingly, even modest angle variations have become unacceptable for these implanters. Various techniques have been tried to avoid angle variation caused by beam deflection. The most common procedure is to deflect the beam back after its original deflection before it reaches the region of impact with the silicon wafer.

Examples of prior art patents addressing the variation in impact angle are U.S. Pat. No. 4,794,305 to Matsukawa; U.S. Pat. No. 4,276,477 to Enge; U.S. Pat. No. 4,687,936 to Mcintyre et al.; and U.S. Pat. No. 4,922,106 to Berriam et al.

U.S. Patent No. 5,091,655 to Dykstra et al. discloses an ion beam implantation system where an ion beam is controllably deflected from an initial trajectory as it passes through spaced parallel plates. Once deflected, the ion beam enters an accelerator that both redeffects the once-deflected ion beam and accelerates the ions within the beam to a final desired energy. Ions within the beam exiting the accelerator follow trajectories that impact the workpiece at controlled impact angles.

As a beam is deflected electrostatically, it is also focused in the plane of deflection. The focusing strength is proportional to the square of the angle of deflection. As a result, the manner in which the beam is imaged varies through the angles of deflection. As the angle of deflection becomes larger, the focusing effect also becomes larger. The consequence of this focusing effect is that the beam size and shape at the target varies as a function of position, making doping uniformity difficult to achieve even though the impact angle of ions with the workpiece is well controlled.

DISCLOSURE OF THE INVENTION

The present invention concerns an ion beam implant system for controllably treating a workpiece and including a source for providing ions that treat the workpiece and a workpiece support for oftenting the workpiece relative to the source. Ions from the source are emitted along a first trajectory until they reach an electrode structure that sets up a dipole field which deflects the ions from the first trajectory. By adjusting electrode voltages applied to the electrode structure, the ions exit the electrode structure at different orientations within a cone of possible trajectories. A second electrode redeffects the ions to a target plane so that the ions intersect the plane at a controlled angle. The target or workpiece is mounted for relative movement through the ion beam so that an entire workpiece is treated.

In accordance with a preferred embodiment of the invention, the angle of deflection through which the ions are bent is fixed. This allows the length of the beam line from the source to the target to be fixed. The beam merely rotates about the initial axis of propagation. This assures good beam integrity and assures that each point on the target is impacted by a controlled distribution of incident angles. These and other objects, advantages and features of the invention will become better understood from the derailed description of a preferred embodiment of the invention which is described in conjunction with the accompanying drawings.

BRIEF DESCRIPTION OF THE DRAWINGS

FIG. 1 is a schematic of an ion implantation system for treating a workpiece at an implantation station;

FIG. 2 is a perspective view showing ion beam deflection about an azimuthal direction;

FIG. 2A is a schematic showing the ion beam impacting a workpiece; and

FIG. 3 is a schematic side view showing deflection of an ion beam.

DETAILED DESCRIPTION OF THE EMBODIMENTS

FIG. 1 depicts an ion implantation system 10 having an ion source 12 for generating an ion beam 14. An extraction power supply 15 biases an extraction electrode of the source to a potential of approximately 20 kilovolts to accelerate ions from the source 12 along a trajectory leading to an ion mass analyzing magnet 16. The magnet 16 bends the beam 14 at approximately a right angle and directs ions having an appropriate mass along a travel path through a shutter 20. The shutter 20 rejects ions having an inappropriate mass from the ion beam 14.

The ion beam 14 next passes through a multi-pole deflection electrode array 28. Control voltages applied by a power supply 29 energize elements of the electrode array 28 to create an electric field having a dipole component. As the ion beam 14 passes through a region bounded by the electrode array 28, ions are deflected at a controlled angle and by a controlled amount based upon the electric potential applied to the electrodes of the array. In a preferred and disclosed embodiment, the array includes eight electrically conductive elongated rods 40–47 (FIG. 2) aligned parallel to each other along the initial trajectory of the ion beam as the beam exits the analyzing magnet. The angular spacing between adjacent electrodes is most preferably $360/8 = -45°$.

Ions deflected by the electrode array 28 pass through a pair of curved constant potential electrodes 48, 49 which redefleet the ions. After this double deflection of the ions, the ions impact a workpiece at a controlled angle of impact. FIG. 1 depicts an implantation station 50 having a wafer support 51 that orients a semiconductor wafer 60 at a position to intercept ions that have been twice deflected. Ion beam collisions with other particles degrade beam integrity so that the entire beam path from the source 12 to the implantation station 50 is evacuated.

At the ion implantation station 50, a chamber 52 is evacuated and wafers are inserted into and withdrawn from load locks to avoid repeated pressurization and depressurization of the chamber 52. A mechanized arm 54 located outside the chamber 52, grasps a wafer supported on a shuttle 62 that has obtained the wafer from a cassette 64. The arm 54 first positions each undoped wafer on a wafer orienter 66. The orienter 66 rotates the undoped wafer to a particular orientation before ion implantation so that as ions strike the wafer, they encounter a specific orientation of the wafer crystal lattice structure. The wafer is moved into a load lock 68 so that a second arm 70 can move the wafers to an implant position within the chamber. At the ion implantation site, a wafer support 59 orients the wafer with respect to the beam and moves the wafer back and forth through the ion beam. Once the wafers have been treated, they are moved by an arm 72 into a second load lock 74. From this second load lock, the wafers are moved by an arm 76 to a shuttle 78 which stores the treated wafers in a cassette 80.

Returning to FIG. 2, the ion beam 14 enters a region bounded by the multiple electrodes of the array 28 is a well defined, collimated beam that has passed through the shutter 20. Through appropriate control of the electrode voltages by the power supply 29, this beam can be made to deflect away from its initial path by a controlled amount and at a controlled angle. In accordance with a preferred embodiment of the present invention, the amount of deflection is held constant and the azimuthal amount of deflection controlled. A time-varying voltage applied by the power supply can, as pictured in FIG. 2, cause the ion beam 14 to sweep out an arcuate range of trajectories as the ion beam leaves the array 28. At any time, the beam follows only one of the paths depicted in FIG. 2 so that FIG. 2 represents a time lapse ion beam depiction.

Turning to FIG. 2A, a portion of an arc 82 that is swept out by the ion beam 14 is shown intersecting a semi-conductor wafer 60. Controlled power supply energization of electrodes that make up the array 28 sweeps back and forth along the arc 82. The support 51 is coupled to an actuator (not shown) that moves the wafer 60 back and forth as designated by the arrow in FIG. 2A to achieve a complete ion implantation of the wafer 60. By appropriate tilting of the wafer 60, the angle of impact between the ion beam and wafer is controlled and relatively uniform ion impact angles are achieved.

The power supply 29 has a control output for each electrode in the array 28. By switching the voltages applied to the array in a regular periodic manner, the dipole field component can be made to sweep back and forth to sweep the ion beam in a controlled arc across the wafer 60.

The deflection plates 48, 49 redeffect the ion beam after the initial deflected by the electrode array 28. As seen in FIG. 2, the electrode arrays 48, 49 also form an arc which eliminates the focusing aspect of the prior art double deflection schemes noted above.

The angles of deflection are fixed so that the length of the beam line from the electrode array 28 to the workpiece support 51 is fixed. In fact, the shape of the ion beam 14 can be made invariant, it simply rotates about the initial axis of propagation. This guarantees stable angle integrity. Large angles of deflection may be achieved by the multi-pole electrode array 28. The consequent strong focusing of the beton is fixed and, therefore, can be properly addressed by use of the arcuate electrode arrays 48, 49. Short beam line transmission is achieved while maintaining large angles of scan for large-diameter wafers.

FIG. 3 depicts a modification in the FIG. 2 arrangement to achieve large scanning angles without large initial deflection angles. This arrangement utilizes a similar multi-pole array of electrodes, but limits the amount of deflection produced by such an array to a small amount, for example, six degrees. A post deflector adds the remaining deflection. This additional deflection is achieved with a cylindrically symmetric electrode 90 positioned downstream from the first multipole element array. From that point on, the FIG. 3 and FIG. 2 embodiments are the same. FIG. 3 shows a cross section through the beam based upon this alternate ion beam scanning arrangement.

The present invention has been described with a degree of particularity, but it is the intent that the invention encompass all modifications and alterations from the disclosed design falling within the spirit or scope of the appended claims.

I claim:

1. An ion beam implant system for controllably treating a workpiece comprising:
   a) source means for providing ions to treat the workpiece;
   b) workpiece support means for orienting the workpiece at a target plane relative the source means;
   c) beam forming means for causing ions emitted by the source means to form an ion beam moving in a first trajectory;
   d) multipole means including an array of electrodes for deflecting ions in said ion beam away from said first trajectory by a controlled deflection angle that does not change as the workpiece is treated;
   e) control means coupled to the multipole deflection means for applying control voltages to energize electrodes of the array to cause the ion beam to scan in an arcuate path while maintaining the controlled angular deflection with respect to the first trajectory;
   f) electrode deflection means for redeflecting the ion beam deflected by the multipole deflection means to the target plane; and
   g) scan means for translating the workpiece support means to cause the ion beam to strike the workpiece at controlled regions on the workpiece surface.

2. The implant system of claim 1 wherein the electrode deflection means comprises spaced arcuate electrode plates biased at control voltages to redeffect the ion beam to the workpiece.

3. A method for ion beam treating a workpiece comprising the steps of:
   a) causing an ion beam to move along an initial trajectory;
   orienting the workpiece at a target location;
   c) generating a time-varying multipole electric field at a region intercepted by the ion beam such that the ion beam is deflected from the initial trajectory by a controlled deflection angle, the deflection angle being fixed for a given workpiece and scans in an arcuate path while maintaining the controlled deflection angle with respect to the initial trajectory;

d) generating a static electric field that redirects the deflected ion beam toward the target location;

e) moving the workpiece in a back and forth manner to cause the ion beam passing through the static electric field to treat an entire workpiece surface.

4. The method of claim 3 wherein the step of generating a time-varying electric multipole field to cause the ion beam to deflect by a controlled deflection angle from an initial trajectory and move in an arcuate path while maintaining the controlled deflection angle with respect to the initial trajectory is performed by cyclically adjusting the orientation of the multipole electric field causing the beam to sweep back and forth in an arcuate path across the workpiece.

5. An ion beam implant system for controllably treating a workpiece comprising:

a) source means for providing ions to treat the workpiece;

b) workpiece support means for orienting the workpiece at a target plane relative the source means;

c) beam forming means for causing ions emitted by the source means to form an ion beam moving in a first trajectory;

d) multipole deflection means including an array of electrodes for deflecting ions in said ion beam from said first trajectory by a controlled deflection angle, the deflection angle being fixed for a given workpiece;

e) electrode deflection means for redeflecting ions deflected by the multipole deflection means to the target plane;

f) scan means for moving the workpiece support means to cause ions to strike the workpiece at controlled regions on the workpiece surface; and g) control means for applying time-varying control signals to the array of electrodes such that the ion beam moves in an arcuate path while maintaining the controlled deflection angle with respect to the first trajectory and causes the beam to sweep across the target plane in an arc.

6. The ion beam implant system of claim 5 wherein the multipole deflection means comprises elongated metallic electrodes extending parallel to each other and generally parallel to a first trajectory of the beam as the beam enters a region bounded by the metallic electrodes.

7. The ion beam implant system of claim 6 wherein the control means individually controls the electric potential on each elongated metallic electrode.

8. The ion beam implant system of claim 5 where the electrode deflection means comprises two spaced apart curved electrodes and a power supply for applying a fixed electric potential between the two spaced apart curved electrodes.

* * * * *